US010734197B2

(12) United States Patent
Iwasaki

(10) Patent No.: US 10,734,197 B2
(45) Date of Patent: Aug. 4, 2020

(54) PLASMA PROCESS APPARATUS

(71) Applicant: Tokyo Electron Limited, Tokyo (JP)

(72) Inventor: Masahide Iwasaki, Hyogo (JP)

(73) Assignee: Tokyo Electron Limited, Tokyo (JP)

( * ) Notice: Subject to any disclaimer, the term of this patent is extended or adjusted under 35 U.S.C. 154(b) by 178 days.

(21) Appl. No.: 15/844,736

(22) Filed: Dec. 18, 2017

(65) Prior Publication Data
US 2018/0108515 A1    Apr. 19, 2018

Related U.S. Application Data

(60) Division of application No. 14/257,040, filed on Apr. 21, 2014, now Pat. No. 9,887,068, which is a
(Continued)

(30) Foreign Application Priority Data

Mar. 29, 2007    (JP) .................................. 2007-088407
Mar. 29, 2007    (JP) .................................. 2007-088653

(51) Int. Cl.
*H01J 37/32*    (2006.01)
*C23C 16/511*    (2006.01)

(52) U.S. Cl.
CPC ...... *H01J 37/32192* (2013.01); *C23C 16/511* (2013.01); *H01J 37/3244* (2013.01); *H01J 37/32229* (2013.01); *H01J 37/32449* (2013.01)

(58) Field of Classification Search
USPC ...................................... 156/345.24–345.28
See application file for complete search history.

(56) References Cited

U.S. PATENT DOCUMENTS 5,134,965 A    8/1992 Tokuda et al.
5,153,406 A *  10/1992 Smith ........................ H01P 5/04
                                                    219/121.42
(Continued)

FOREIGN PATENT DOCUMENTS

JP    2001-060557    3/2001
JP    2002-203844    7/2002
(Continued)

OTHER PUBLICATIONS

Korean Office Action for 10-2009-7022751 dated May 11, 2011 with partial English translation.
(Continued)

*Primary Examiner* — Rakesh K Dhingra
(74) *Attorney, Agent, or Firm* — IPUSA, PLLC

(57) ABSTRACT

A plasma process apparatus that utilizes plasma so as to perform a predetermined process on a substrate, and includes a process chamber that houses a substrate subjected to the predetermined plasma process; a microwave generator; a dielectric window attached to the process chamber and provided with a concave portion provided at an outer surface of the dielectric window opposite to the process chamber and a through hole penetrating the dielectric window to the process chamber; a microwave transmission line; and a first process gas supplying portion including a gas conduit including a first portion provided at a front end and a second portion having a larger diameter than the first portion, the gas conduit being inserted from outside of the process chamber such that the first portion is inserted in the through hole and the second portion is inserted in the concave portion.

7 Claims, 9 Drawing Sheets

Related U.S. Application Data continuation of application No. 12/531,510, filed as application No. PCT/JP2008/056744 on Mar. 28, 2008, now abandoned.

(60) Provisional application No. 60/945,958, filed on Jun. 25, 2007, provisional application No. 60/947,524, filed on Jul. 2, 2007.

(56) References Cited

U.S. PATENT DOCUMENTS

| | | |
|---|---|---|
| 5,698,036 A | 12/1997 | Ishii et al. |
| 5,734,143 A | 3/1998 | Kawase et al. |
| 5,810,933 A * | 9/1998 | Mountsier ......... H01L 21/67109 118/724 |
| 6,034,346 A | 3/2000 | Yoshioka et al. |
| 6,057,645 A | 5/2000 | Srivastava et al. |
| 6,433,298 B1 | 8/2002 | Ishii |
| 6,622,650 B2 | 9/2003 | Ishii et al. |
| 6,706,141 B1 | 3/2004 | Steinhardt et al. |
| 7,122,096 B2 * | 10/2006 | Tanaka ............... H01J 37/32935 156/345.24 |
| 7,685,965 B1 | 3/2010 | Hao et al. |
| 2002/0088545 A1 | 7/2002 | Lee et al. |
| 2004/0118520 A1 * | 6/2004 | Nakayama ........ H01J 37/32192 156/345.41 |
| 2004/0168769 A1 | 9/2004 | Matsuoka et al. |
| 2005/0223992 A1 | 10/2005 | Asmussen et al. |
| 2006/0082785 A1 * | 4/2006 | Janos ................. G01B 11/0675 356/503 |
| 2006/0225656 A1 * | 10/2006 | Horiguchi ......... H01J 37/32192 118/723 MW |
| 2007/0137575 A1 | 6/2007 | Ohmi et al. |
| 2008/0110400 A1 | 5/2008 | Satou et al. |

FOREIGN PATENT DOCUMENTS

| | | |
|---|---|---|
| JP | 2003-332326 | 11/2003 |
| JP | 2006-502556 | 1/2006 |
| JP | 2006-210929 | 10/2006 |
| WO | 1999/049705 | 9/1999 |
| WO | 2005/045913 | 5/2005 |

OTHER PUBLICATIONS

Chinese Office Action for 200880010562.7 dated Aug. 11, 2010 with partial English translation.
Korean Office Action for 10-2011-7016076 dated Oct. 5, 2011 with partial English translation.
Taiwanese Office Action for 097111557 dated Sep. 16, 2011 with partial English translation.

* cited by examiner

PLASMA PROCESS APPARATUS

CROSS-REFERENCE TO RELATED APPLICATIONS

This application is a divisional application of U.S. patent application Ser. No. 14/257,040 filed on Apr. 21, 2014, which is a continuation application of U.S. patent application Ser. No. 12/531,510 filed on Sep. 16, 2009, which claims the benefit of priority of PCT International Application No. PCT/JP2008/056744 filed on Mar. 28, 2008, Japanese Patent Applications No. 2007-088407 and No. 2007-088653 filed with the Japanese Patent Office on Mar. 29, 2007, U.S. Provisional Applications No. 60/945,958 and No. 60/947,524 filed with the United States Patent and Trademark Office on Jun. 25, 2007 and Jul. 2, 2007, respectively, where the entire contents of all applications are incorporated herein by reference.

BACKGROUND OF THE INVENTION

1. Field of the Invention

The present invention relates to a microwave plasma process apparatus that utilizes microwaves so as to carry out a predetermined plasma process, specifically to a microwave plasma process apparatus that supplies microwave power to plasma in a process chamber through electromagnetic wave coupling.

2. Description of the Related Art

In plasma processes for fabricating semiconductor devices, liquid crystal displays (LCD), and the like, radio frequency (RF) waves and microwaves are used so as to discharge or ionize a process gas in a vacuum process chamber. An RF plasma apparatus mainly employs capacity coupling where a pair of electrodes is located, one electrode in parallel with the other leaving an appropriate gap between the electrodes in the process chamber. The RF waves are applied to one of the electrodes through a capacitor while the other electrode is grounded. However, it is difficult to produce high density plasma at relatively low pressures in the RF plasma apparatus. In addition, it is disadvantageous in that device elements on a wafer are more frequently damaged during the plasma process because the RF plasma inherently has high electron temperatures.

In contrast, the microwave plasma apparatus is advantageous in that the microwaves can produce high density plasma with low electron temperatures at relatively low pressures. Additionally, the microwave plasma apparatus has another advantage in that the microwave plasma can be efficiently produced in a two-dimensional large area at a wider pressure range when a planar microwave introduction window through which the microwaves are introduced into the chamber is employed. Moreover, the microwave plasma apparatus may have a simple configuration as a whole because a magnetic field is not required (see Patent Document 1).

Patent Document 1: WO2005/045913 A1 (FIG. 1(A), FIG. 2)

In a microwave plasma process apparatus, since microwave plasma is generated from a process gas by introducing microwaves and the process gas into the process chamber, the ways of introducing the microwaves and the process gas may be important factors that determine plasma characteristics and apparatus performance.

In the microwave plasma apparatus employing the planar microwave introduction window, there are two types of configurations in terms of introducing the process gas into the chamber. A first configuration has a shower plate serving as the microwave introduction window that opposes a susceptor. In this configuration, the process gas is ejected downward through plural gas ejection holes uniformly distributed in the shower plate.

On the other hand, a second configuration has one or plural gas ejection holes formed in a side wall of the chamber in order to eject the process gas inward to a plasma region in the chamber.

In the first configuration, while it is advantageous in that the plasma can be uniformly produced above the susceptor, the plasma density tends to be lower, which leads to a low etching rate when the plasma process apparatus is an etcher, and an inefficient process as a whole. This is because the shower plate having plural gas ejection holes provides a pathway through which the microwaves (electromagnetic waves) pass. In addition, such a configuration may cause a problem of contamination or the like.

On the other hand, in the second configuration, since the microwaves do not pass through the gas ejection holes made in the side wall of the chamber, abnormal discharging is unlikely to take place. However, it is difficult to diffuse the process gas uniformly in a radial direction, resulting in nonuniformly distributed plasma. Especially, since the chamber of a single-wafer plasma process apparatus is evacuated through a ring-like space between the susceptor and the inner wall of the chamber, the process gas tends to flow with nonuniform flow patterns in the chamber. This is because the process gas, which is introduced so as to flow over the ring-like space, is affected by a flow of gas headed toward an evacuation port below the ring-like space.

In addition, the process gas may be introduced into the process chamber through a gas ejection hole formed (pierced) through a dielectric window, which corresponds to a ceiling surface of the process chamber and opposes the susceptor.

In this case, since the dielectric window serves as a microwave introduction window, that is, as a microwave propagation path, there exists an electric field inside the dielectric window. Therefore, the process gas is exposed to the microwave electric field when flowing through the dielectric window, and thus may be ionized in a gas conduit in the dielectric window or near the gas ejection hole, which causes abnormal discharging. Such abnormal discharging may affect the dielectric window, so that the dielectric window is deteriorated or damaged in a relatively short period of time, and may impair process performance.

The present invention has been made in order to eliminate at least one of the above-mentioned disadvantages, and provides a plasma process apparatus that can prevent abnormal discharging in a microwave transmission line or radiation path, or a process gas ejection portion, so that plasma excellent in plasma density uniformity and controllability can be realized, thereby improving performance or quality of the plasma process.

In addition, the present disclosure may provide a plasma process apparatus in which plasma conditions or the plasma process can easily and efficiently be monitored.

SUMMARY OF THE INVENTION

In order to eliminate any one of the above disadvantages, a first aspect of the present embodiment provides a plasma process apparatus that processes a substrate utilizing plasma.

The plasma process apparatus includes a process chamber that houses a substrate subjected to a predetermined plasma process and may be evacuated to a reduced pressure; a microwave generator that generates microwaves for generating plasma; a waveguide pipe that transmits the microwaves from the microwave generator to the process chamber; a waveguide pipe/coaxial pipe converter connected to one end of the waveguide pipe; a coaxial pipe that forms a line through which the microwaves are transmitted from the waveguide pipe-coaxial pipe converter to the process chamber, wherein an inner conductive body of the coaxial pipe has a hollow portion; and a first process gas supplying portion that supplies a process gas into the process chamber through the hollow portion of the inner conductive body of the coaxial pipe.

In the plasma process apparatus according to the first aspect, the microwaves output from the microwave generator propagate through the microwave transmission line including the waveguide pipe, the waveguide pipe/coaxial pipe converter, and the coaxial pipe, and are introduced into the process chamber, while the process gas from the process gas supplier flows through the hollow portion of the inner conductive body of the coaxial pipe, circumventing a microwave propagation path, and is introduced into the process chamber. The process gas is ionized by the microwaves so as to generate plasma in the process chamber. Utilizing the plasma, the substrate is processed.

As one of preferred embodiments, the plasma process apparatus according to the first aspect may further include a susceptor on which the substrate is placed in the process chamber, and a dielectric window for introducing the microwaves into the process chamber, where the dielectric window serves as a ceiling surface opposing the susceptor. With this, the microwaves propagate as surface waves along a lower surface of the dielectric window, and the plasma is generated by the surface waves. In addition, the dielectric window may be provided with a gas ejection opening that is in communication with the hollow portion of the inner conductive body, where the process gas can be ejected from the gas ejection opening into the process chamber.

According to another preferred embodiment, the dielectric window may be one of constituent elements of a planar antenna to which an end portion of the coaxial pipe is connected. This planar antenna may be a slot antenna in order to efficiently generate high density plasma. Moreover, the planar antenna may include a radial line slot antenna in order to generate a large area, or large diameter plasma.

According to another preferred embodiment, the waveguide pipe-coaxial pipe converter converts the transmission mode in the waveguide pipe to a TEM mode in the coaxial pipe. Preferably, the waveguide pipe may be square-shaped, where one end portion of the inner conductive body protrudes into the square-shaped waveguide pipe, and the protruding end portion becomes thicker along the protruding direction in the waveguide pipe-coaxial pipe converter. In addition, the hollow portion penetrates the inner conductive body of the coaxial pipe so as to allow a process gas to enter the hollow portion from an inlet opening made in the protruding end portion of the inner conductive portion and to be ejected from a hole directed toward the interior of the process chamber. Moreover, the inner conductive body of the coaxial pipe may include a coolant conduit through which a coolant may flow.

As another preferred embodiment, the plasma process apparatuses with at least one of the above-stated additional features may be provided with a second process gas supplying portion that introduces a process gas into the chamber. The second process gas supplying portion may include a side wall eject hole from which the process gas is ejected toward a center portion of the process chamber. In this case, there may be provided a first flow rate control portion that controls the flow rate of the process gas introduced into the process chamber through the first process gas supplying portion; and a second flow rate control portion that controls the flow rate of the process gas introduced into the process chamber through the second process gas supplying portion. With these, flow rates or the flow ratio of the process gasses introduced into the process chamber from the corresponding process gas supplying portions are controlled, thereby improving plasma density and distribution uniformity.

Furthermore, the plasma process apparatus according to other embodiments may include a radio frequency wave generator that applies radio frequency waves to the susceptor in order to generate a self bias voltage in the susceptor, or a magnetic field producing portion that surrounds the process chamber so as to produce a magnetic field around the process chamber, thereby causing electron cyclotron resonance in the plasma in the process chamber.

A second aspect of the present embodiment provides a plasma process apparatus in which a substrate subjected to a predetermined plasma process is housed in a process chamber that may be evacuated to a reduced pressure and plasma is generated from a process gas introduced into the process chamber by introducing microwaves so as to perform the predetermined plasma process on the substrate. The plasma process apparatus includes a microwave transmission line that transmits the microwaves from a microwave generator to the process chamber, wherein a predetermined section of the microwave transmission line, the section including one end portion of the microwave transmission line, is formed of a coaxial line, and wherein an inner conductive body of the coaxial line is formed of a hollow pipe through which the process gas is introduced into the process chamber.

A third aspect of the present embodiment provides a plasma process apparatus in which a substrate subjected to a predetermined plasma process is housed in a process chamber that may be evacuated to a reduced pressure and plasma is generated from a process gas introduced into the process chamber by introducing microwaves so as to perform the predetermined plasma process on the substrate. The plasma process apparatus includes a microwave transmission line that transmits the microwaves from a microwave generator to the process chamber, wherein a predetermined section of the microwave transmission line, the section including one end portion of the microwave transmission line, is formed of a coaxial line whose inner conductive body is famed of a hollow pipe, and a monitor portion that monitors through the hollow pipe the plasma process performed in the process chamber.

In the plasma process apparatus according to the third aspect, the microwaves output from the microwave generator propagate through the microwave transmission line and are introduced into the process chamber, and the microwaves ionize the process gas so as to generate plasma in the process chamber. The substrate is processed with the plasma. When this process is performed, the plasma conditions or the plasma process in the process chamber can be monitored in-situ through the hollow portion of the inner conductive body of the coaxial pipe that may constitute at least one portion of the microwave transmission line by the monitor portion. The monitor portion includes a plasma emission measurement portion that spectroscopically measures emission of the plasma in the process chamber, an optical thickness measurement portion that measures the thickness of a film on the substrate held on a susceptor in the process chamber, or a temperature sensor that measures temperature inside the process chamber.

A fourth aspect of the present embodiment provides a plasma process apparatus that utilizes plasma so as to perform a predetermined process on a substrate. The plasma process apparatus includes a process chamber that houses a substrate subjected to the predetermined plasma process and may be evacuated to a reduced pressure; a microwave generator that generates microwaves for generating plasma; a dielectric window through which the microwaves are introduced to the process chamber; a microwave transmission line that transmits the microwaves from the microwave generator to the dielectric window; and a first process gas supplying portion including a gas conduit that penetrates the dielectric window to the process chamber in order to supply a process gas into the process chamber, the gas conduit being electrically conductive and grounded.

In the plasma process apparatus according to the fourth aspect of the present embodiment, the process gas from a process gas supplier of the first process gas supplying portion flows through the gas conduit, which is grounded, and the dielectric window. Therefore, the process gas is not exposed to an electric field due to the microwaves, and thus abnormal discharging can be prevented.

As one of preferred embodiments, the gas conduit may penetrate one portion of the dielectric window, or plural of the gas conduits may penetrate corresponding plural portions of the dielectric window in the plasma process apparatus according to the fourth aspect. In view of a symmetric gas flow pattern, the gas conduit preferably penetrates substantially the center of the dielectric window when the gas conduit penetrates one portion of the dielectric window, and the plural portions are preferably located symmetrically in relation to substantially the center of the dielectric window.

As another preferred embodiment, a gas ejection portion of the gas conduit may protrude into the process chamber from the dielectric window, and specifically the gas ejection portion of the gas conduit is preferably at a distance 10 mm or more from the dielectric window in the plasma process apparatus according to the fourth aspect. With this configuration, the gas ejection portion can be located out of a plasma generation region, or in a plasma diffusion region, so as to prevent abnormal discharging around the gas ejection portion.

In addition, the plasma process apparatus according to the fourth aspect may include a susceptor on which the substrate is placed in the process chamber, wherein the dielectric window serves as a ceiling surface opposing the susceptor. When the susceptor is provided, the plasma process apparatus may preferably be provided with a radio frequency wave generator in order to apply radio frequency waves in order to generate a self bias voltage in the susceptor and thus attract ions in the plasma.

As another preferred embodiment, the dielectric window is one of constituent elements of a planar antenna in the plasma process apparatus according to the fourth aspect with at least one of the above-stated additional features. In this case, the planar antenna may include a radial line slot antenna. In addition, the microwave transmission line includes a coaxial pipe whose end portion is connected to the planar antenna.

As another preferred embodiment, the gas conduit is formed in an inner conductive body in the plasma process apparatus according to the fourth aspect with at least one of the above-stated additional features. In this case, the inner conductive body preferably includes a hollow portion that may be used to allow gas to flow therethrough, the hollow portion extending along a center axis of the inner conductive body. Moreover, the gas conduit is preferably in communication with the hollow portion and extends into the process chamber through a through hole made in the dielectric window. With these, the process gas can be introduced into the process chamber through an efficient and simplified gas introduction configuration.

As another preferred embodiment, the microwave transmission line includes a waveguide pipe one of whose ends is connected to the microwave generator; a waveguide pipe/coaxial pipe converter that couples another end of the waveguide pipe with one end of the coaxial pipe in order to convert one transmission mode of electromagnetic waves in the waveguide pipe to another transmission mode in the coaxial pipe. In this case, the microwaves output from the microwave generator propagate through the waveguide pipe, the waveguide pipe/coaxial pipe converter, and the coaxial pipe and are introduced into the process chamber, while the process gas from the process gas supplying portion flows through the gas conduit, which is grounded, including the inner conductive body of the coaxial pipe, without being exposed to the electric field due to the microwaves and is introduced into the process chamber, As another preferred embodiment, the plasma process apparatus according to the fourth aspect further includes a second process gas supplying portion that introduces the process gas into the chamber. The second process gas supplying portion may include a side wall eject hole from which the process gas is ejected toward a center portion of the process chamber. In this case, the plasma process apparatus according to the fourth aspect further includes a first flow rate control portion that controls a flow rate of the process gas introduced into the process chamber by the first process gas supplying portion; and a second flow rate control portion that controls a flow rate of the process gas introduced into the process chamber by the second process gas supplying portion. With these, flow rates or the flow ratio of the process gasses introduced into the process chamber from the corresponding process gas supplying portion are controlled, thereby improving plasma density and distribution uniformity.

A fifth aspect of the present embodiment provides a plasma process apparatus that utilizes plasma so as to perform a predetermined process on a substrate. The plasma process apparatus includes a process chamber that houses a substrate subjected to the predetermined plasma process; an evacuation portion that evacuates the process chamber to a reduced pressure; a gas supplying line for supplying a process gas into the process chamber, the gas supplying line being electrically conductive and grounded; a microwave generator that generates microwaves for generating plasma; a dielectric window through which the microwaves are introduced to the process chamber, the dielectric window extending around the gas supplying line; and a microwave transmission line that transmits the microwaves from the microwave generator to the dielectric window.

In the plasma process apparatus according to the fifth aspect, the process gas from a process gas supplier of the process gas supplying portion flows through the gas supplying line, and is introduced into the process chamber, while the microwaves output from the microwave generator propagate through the microwave transmission line, and are introduced into the process chamber through the dielectric window extending around the gas supplying line. The process gas ejected from a gas ejection opening of one end of the gas supplying line diffuses in the chamber, and is ionized near the dielectric window by the microwaves. Even in this plasma process apparatus, the end of the gas supplying line preferably protrudes from the dielectric window into the process chamber.

According to embodiments, a plasma process apparatus that can prevent abnormal discharging in a microwave transmission line or radiation path, or a process gas ejection portion, is provided, so that plasma excellent in plasma density uniformity and controllability can be realized, thereby improving performance or quality of the plasma process. In addition, a plasma process apparatus in which plasma conditions or a plasma process can easily be monitored may also be provided.

DETAILED DESCRIPTION OF THE PREFERRED EMBODIMENTS

Figure 1:
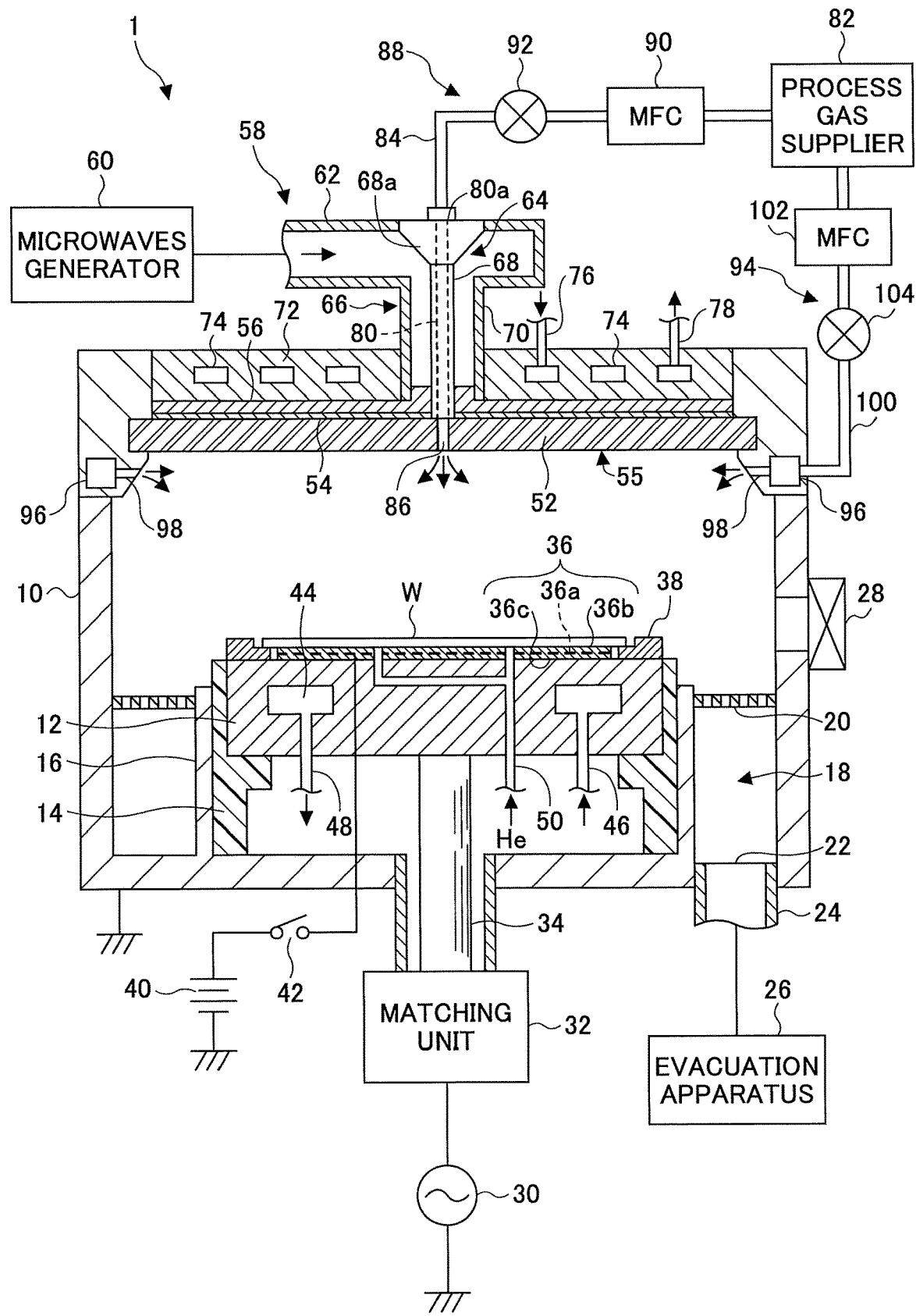
FIG. 1 is a schematic cut-open view of a plasma process apparatus according to a first embodiment.

Non-limiting, exemplary embodiments of the present invention will now be described with reference to the accompanying drawings. In the drawings, the same or corresponding reference marks are given to the same or corresponding members or components. It is to be noted that the drawings are illustrative of the disclosure, and there is no intention to indicate scale or relative proportions among the members or components, alone or therebetween. Therefore, a specific thickness or size should be determined by a person having ordinary skill in the art in view of the following non-limiting embodiments.

First Embodiment

FIG. 1 is a schematic cut-open view of a microwave plasma etching apparatus 1 according to a first embodiment. The microwave plasma etching apparatus 1, which is configured as a planar SWP type plasma process apparatus, has a cylinder-shaped chamber (process chamber) 10 made of metal such as aluminum or stainless steel. The chamber 10 is grounded for security reasons.

First, components or members, which do not directly contribute to generating the microwave plasma in the chamber 10 of the microwave plasma etching apparatus 1, are described.

In a lower center portion of the chamber 10, there is a susceptor 12 on which a semiconductor wafer W (referred to as a wafer W below) is placed. The susceptor 12 is horizontally supported by a cylindrical supporting portion 14 extending upward from the bottom of the chamber 10. The cylindrical supporting portion 14 is made of an insulating material. Additionally, the susceptor 12 is shaped into a circular plate and made of, for example, aluminum, serving also as a lower electrode to which radio frequency waves are applied.

A ring-like evacuation pathway 18 is provided between the inner wall of the chamber 10 and another cylindrical supporting portion 16 that extends upward from the bottom of the chamber 10 and along the outer circumferential surface of the cylindrical supporting portion 14. The cylindrical supporting portion 16 is electrically conductive. A ring-like baffle plate 20 is arranged at a top portion (or an inlet portion) of the evacuation pathway 18, and an evacuation port 22 is provided below the evacuation pathway 18. In order to obtain uniform gas flow patterns distributed symmetrically in relation to the wafer W on the susceptor 12 in the chamber 10, plural of the evacuation ports 22 are preferably provided at equal angular intervals along a circumferential direction. Each of the evacuation ports 22 is connected to an evacuation apparatus 26 through an evacuation pipe 24. The evacuation apparatus 26 may have a vacuum pump such as a turbo molecular pump (TMP), which can evacuate the chamber 10 to a desired reduced pressure. A gate valve 28 is attached on an outer wall of the chamber 10. The gate valve 28 opens and closes a transport opening through which the wafer W is transported into or out from the chamber 10.

The susceptor 12 is electrically connected to a radio frequency power supply 30 that applies an RF bias voltage to the susceptor 12 through a matching unit 32 and a power feeding rod 34. The power supply 30 outputs, at a predetermined electric power level, radio frequency waves having a relatively low frequency of, for example, 13.56 MHz. Such a low frequency is suitable to control the energy of ions to be attracted to the wafer W on the susceptor 12. The matching unit 32 includes a matching element for matching output impedance of the power supply 30 with impedance of a load including the electrode (susceptor), the plasma produced in the chamber 10, and the chamber 10. The matching element has a blocking condenser for generating self bias.

An electrostatic chuck 36 is provided on the upper surface of the susceptor 12. The electrostatic chuck 36 holds the wafer W by electrostatic force on the susceptor 12. The electrostatic chuck 36 has an electrode 36a formed of an electroconductive film and a pair of insulating films 36b, 36c that sandwich the electrode 36a. A DC power supply 40 is electrically connected to the electrode 36a via a switch 42. The DC voltage applied to the electrostatic chuck 36 from the DC power supply 40 produces a Coulomb force, which in turn holds the wafer W onto the electrostatic chuck 36. Outside the electrostatic chuck 36, a focus ring 38 is provided in order to surround the wafer W.

A cooling medium chamber 44 is provided inside the susceptor 12. The cooling medium chamber 44 has a ring-shape extending in a circumferential direction. A cooling medium or cooling water at a predetermined temperature is supplied to the cooling medium chamber 44 through conduits 46, 48 from a chiller unit (not shown) so as to circulate through the cooling medium chamber 44 and the conduits 46, 48. Due to the temperature-controlled cooling medium or the like, the temperature of the wafer W on the electrostatic chuck 36 may be controlled. In addition, a thermal conduction gas such as He gas is supplied between the wafer W and the electrostatic chuck 36 through a gas supplying pipe 50 from a thermal conduction gas supplying portion (not shown). Moreover, the chamber 10 is provided with elevatable lift pins (not shown) that vertically penetrate the susceptor 12 and raise/lower the wafer W when the wafer W is loaded into or unloaded from the chamber 10. The lift pins may be driven by an elevation mechanism (not shown).

Next, components or members which contribute to generating the microwave plasma in the chamber 10 of the microwave plasma etching apparatus 1 are described.

A planar antenna 55 is provided above the susceptor 12 in order to introduce the microwaves into the chamber 10. The planar antenna 55 includes a circular quartz plate 52 as a dielectric window and a circular radial line slot antenna (RLSA) 54. Specifically, the quartz plate 52 is hermetically attached to the chamber 10 and serves as a ceiling surface of the chamber 10 that opposes the susceptor 12. The RLSA 54 is located on the upper surface of the quartz plate 52, and has plural slots distributed along concentric circles. The RLSA 54 is electromagnetically coupled to a microwave transmission line 58 via a slow wave plate 56 formed of a dielectric material, for example, quartz.

The microwave transmission line 58 has a waveguide pipe 62, a waveguide pipe/coaxial pipe converter 64, and a coaxial pipe 66, and transmits the microwaves output from a microwave generator 60 to the RLSA 54. The waveguide pipe 62 is formed of, for example, a square pipe, and transmits the microwaves in a TE mode from the microwave generator 60 through the waveguide pipe-coaxial pipe converter 64.

Figure 2:
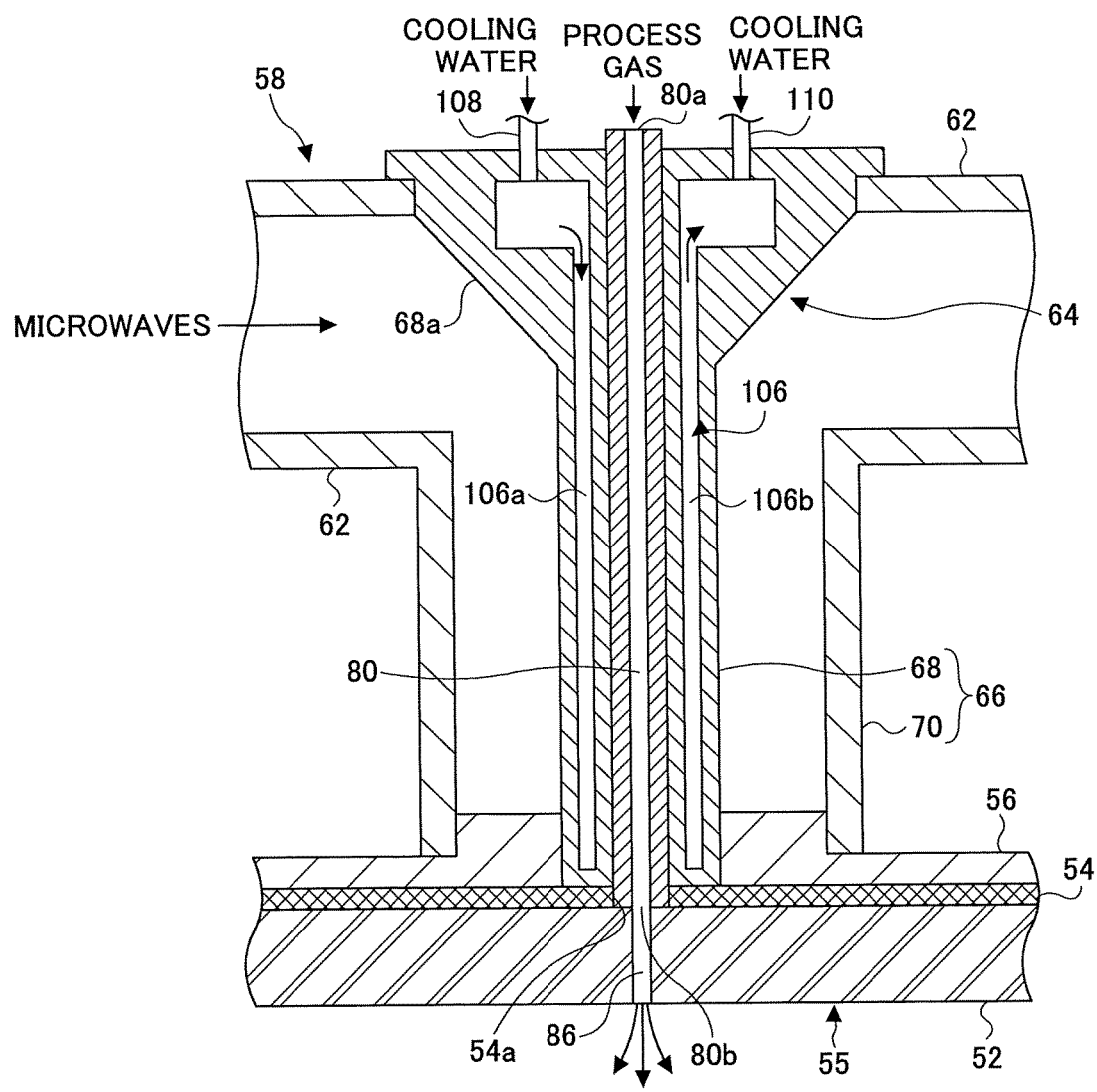
FIG. 2 schematically shows a primary portion of the plasma process apparatus shown in FIG. 1.

The waveguide pipe/coaxial pipe converter 64 couples the waveguide pipe 62 with the coaxial pipe 66, and converts the TE mode microwaves in the waveguide pipe 62 to TEM mode microwaves in the coaxial pipe 66. The converter 64 preferably has a larger diameter at an upper portion connected to the waveguide pipe 62, and a smaller diameter at a lower portion connected to an inner conductor 68 of the coaxial pipe 66 in order to avoid a concentrated electromagnetic field, which may be present at high power transmission levels. In other words, the converter 64 is preferably shaped into an inverted cone (or a door knob) as shown in FIGS. 1 and 2. The converter 64 may be referred to as an inverted cone portion 68a for simplicity of explanation below.

The coaxial pipe 66 extends vertically downward from the converter 64 to an upper center portion of the chamber 10 and is coupled with the RLSA 54. Specifically, the coaxial pipe 66 has an outer conductor 70 and the inner conductor 68. The outer conductor 70 is connected to the waveguide pipe 62 at the upper end and extends downward so as to reach the slow wave plate 56. The inner conductor 68 is connected to the converter 64 at the upper end and extends downward so as to reach the RLSA 54. The microwaves propagate in the TEM mode between the inner conductor 68 and the outer conductor 70.

The microwaves output from the microwave generator 60 are transmitted through the microwave transmission line 58 including the waveguide pipe 62, the converter 64, and the coaxial pipe 66, and are supplied to the RLSA 54 passing through the slow wave plate 56. Then, the microwaves are spread in a radial direction in the slow wave plate 56 and emitted toward the chamber 10 through the slots of the RLSA 54. The microwaves emitted through the slots propagate along the lower surface of the quartz plate 52 as surface waves, and ionize gas near the lower surface of the quartz plate 52, thereby generating plasma in the chamber 10.

An antenna back surface plate 72 is provided on the upper surface of the slow wave plate 56. The antenna back surface plate 72 is made of, for example, aluminum. The antenna back surface plate 72 contains fluid conduits 74 to which a chiller unit (not shown) is connected so that a cooling medium or cooling water at a predetermined temperature is circulated through the conduits 74 and pipes 76, 78. Namely, the antenna back surface plate 72 serves as a cooling jacket that absorbs heat generated in the quartz plate 52 and transfers the heat to the outside.

As shown in FIG. 1, a gas conduit 80 is provided so as to go through the inner conductor 68 of the coaxial pipe 66 in this embodiment. In addition, a first gas supplying pipe 84 (FIG. 1) is connected at one end to an upper opening of the gas conduit 80 and at the other end to a process gas supplier 82. Moreover, a gas ejection opening 86 is formed at the center portion of the quartz plate 52 and open to the chamber 10. In a first process gas introduction portion 88 having the above configuration, the process gas from the process gas supplier 82 flows through the first gas supplying pipe 84 and the gas conduit 80 in the coaxial pipe 66, and is ejected from the gas ejection opening 86 toward the susceptor 12 located below the gas ejection opening 86. The ejected process gas is spread outward in a radial direction in the chamber 10, partly because the process gas is pulled toward the evacuation pathway 18 surrounding the susceptor 12 by the evacuation apparatus 26. By the way, the first gas supplying pipe 84 is provided with a mass flow controller (MFC) 90 and an on-off valve 92 in the middle.

In this embodiment, a second process gas introduction portion 94 is provided in addition to the first process gas introduction portion 88 in order to introduce the process gas to the chamber 10. The second process gas introduction portion 94 includes a buffer chamber 96, plural side ejection holes 98, and a gas supplying pipe 100. The buffer chamber 98 is shaped into a hollow ring that extends inside the side wall portion of the chamber 10 and along a circumferential direction of the side wall portion, and is located slightly lower than the quartz plate 52. The plural side ejection holes 98 are open toward the plasma region in the chamber 10, arranged at equal angular intervals along an inner wall of the chamber 10, and in gaseous communication with the buffer chamber 96. The gas supplying pipe 100 connects the buffer chamber 96 to the process gas supplier 82. The gas supplying pipe 100 is provided with an MFC 102 and an on-off valve 104 in the middle.

In the second process gas introduction portion 94, the process gas from the process gas supplier 82 is introduced into the buffer chamber 96 in the side wall portion of the chamber 10 through the second process gas supplying pipe 100. Pressure in the buffer chamber 96 filled with the process gas becomes uniform along the circumferential direction of the buffer chamber 96, which allows the process gas to be uniformly and horizontally ejected from the plural ejection holes 98 toward the plasma region in the chamber 10. In this case, it may be difficult to uniformly distribute the process gas ejected from the ejection holes 98 above the wafer W, because the process gas is pulled toward the evacuation ports 22 when the process gas flows over the evacuation pathway 18. However, since the process gas ejected from the gas ejection opening 86 located at the center of the quartz plate 52 is spread in an outward radial direction and flows toward the evacuation pathway 18 as stated above, the process gas ejected from the side ejection holes 98 is not affected to a great extent by the evacuation apparatus 26 in this embodiment. Therefore, the plasma can be uniformly distributed above the wafer W on the susceptor 12.

By the way, the process gases introduced into the chamber 10 respectively from the first process gas introduction portion 88 and the second process gas introduction portion 94 may be the same, or different. Flow rates of the gases can be controlled by the MFCs 90 and 102, respectively, or the gases are introduced into the chamber at a predetermined flow rate ratio, so that the gases and thus the plasma are uniformly distributed in the radial direction.

Referring to FIG. 2, the waveguide pipe-coaxial pipe converter 64 and the coaxial pipe 66 are shown in detail. The inner conductor 68 is made of, for example, aluminum. The gas conduit 80 penetrates the inner conductor 68 along a center axis of the inner conductor 68. In addition, a cooling medium conduit 106 is famed in parallel with the gas conduit 80. The cooling medium conduit 106 includes an incoming path 106a and an outgoing path 106b that are divided by a vertical partition (not shown). In the upper portion of the inverse cone portion 68a, a pipe 108 is connected to the incoming path 106a of the cooling medium conduit 106. The opposite end of the pipe 108 is connected to a chiller unit (not shown). In addition, a pipe 110 is connected to the outgoing path 106b of the cooling medium conduit 106. The opposite end of the pipe 110 is connected to the same chiller unit. With this configuration, a cooling medium or cooling water supplied from the chiller unit flows downward through the incoming path 106a so as to reach the bottom of the incoming path 106a and returns back upward through the outgoing path 106b so as to flow into the pipe 110. In such a manner, the inner conductor 68 may be cooled.

At the center of the RLSA 54, there is an opening 54a into which the gas conduit 80 is fitted, as shown in FIG. 2. In addition, the opening 54a is located in coaxial alignment with the gas ejection opening 86 of the quartz plate 52. With this configuration, the electromagnetic waves (microwaves) radiated from the RLSA 54 do not reach the gas ejection opening 86, and thus no discharging takes place in the gas ejection opening 86. By the way, the gas ejection opening 86 may be branched into plural holes in the quartz plate 52. The plural holes may be located within a certain range in the radial direction of the quartz plate 52.

Figure 3:
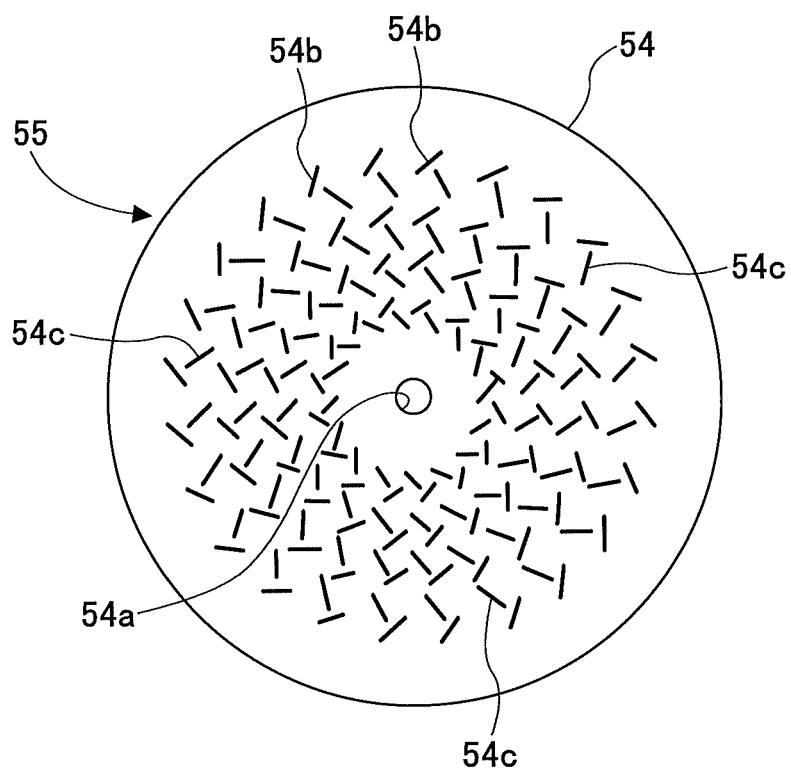
FIG. 3 is a plan view of a slot antenna used in the plasma process apparatus shown in FIG. 1.

FIG. 3 shows a slot pattern in the RLSA 54 in this embodiment. As shown, the RLSA 54 has plural slots distributed in concentric circles. Specifically, two kinds of slots 54b, 54c whose longitudinal directions are substantially at right angles are distributed in alternating concentric circles. These concentric circles are arranged at radial intervals depending on wavelengths of the microwaves propagating in the radial direction of the RLSA 54. According to such a slot pattern, the microwaves are converted into circularly polarized planar waves having two polarization components intersecting with each other, and the planar waves are radiated from the RLSA 54. The RLSA 54 configured as described above is advantageous in that the microwaves may be uniformly radiated into the chamber 10 (FIG. 1) from substantially the entire region of the antenna, and suitable to generate nonuniform and stable plasma.

By the way, various operations of the evacuation apparatus 26, the RF power supplier 30, the switch 42 of the DC power supplier 40, the microwave generator 60, the process gas introduction portions 88, 94, the chiller units (not shown), and the thermal conduction gas supplying portion (not shown), and total operations as a whole are controlled by a controlling portion (not shown) composed of, for example, a microcomputer in the microwave plasma etching apparatus 1 according to the first embodiment.

In order to carry out an etching process in this microwave plasma etching apparatus 1, the gate valve 28 is opened, and a wafer W subjected to the etching process is transferred into the chamber 10 and placed on the electrostatic chuck 36. Then, etching gases (generally, mixed gases) are introduced at predetermined flow rates and a predetermined ratio from the first process gas introduction portion 88 and the second process gas introduction portion 94, respectively. At this time, the chamber 10 is evacuated by the evacuation apparatus 26 so that the inner pressure of the chamber 10 becomes at a set pressure. In addition, the RF power source 30 is activated in order to output the RF waves at a predetermined power level to the susceptor 12 through the matching element 32 and the power feeding rod 34. Moreover, the switch 42 is turned on in order to apply the DC voltage from the DC voltage supplier 44 to the electrode 36a of the electrostatic chuck 36, by which the wafer W is firmly held on the electrostatic chuck 36. Then, the microwave generator 60 is turned on in order to apply the microwaves to the RLSA 54 through the microwave transmission line 58, and thus the microwaves are introduced into the chamber 10 from the RLSA 54 through the quartz plate 52.

The etching gases introduced into the chamber 10 from the gas ejection opening 86 of the first process gas introduction portion 88 and the side ejection holes 98 of the second process gas introduction portion 94 diffuse below the quartz plate 52 and are ionized by the microwave energy radiated from the surface waves (microwaves) propagating along the lower surface of the quartz plate 52, and thus the surface plasma is generated. Then, the plasma generated below the quartz plate 52 diffuses downward so as to etch a film on the wafer W in an isotropic manner with radicals in the plasma, or to vertically etch the film by irradiation of ions in the plasma.

In the microwave plasma etching apparatus 1 as the microwave plasma etching apparatus, high density plasma is generated through surface wave excitation, so that the electron temperature of the plasma near the wafer W on the susceptor 12 is as low as about 0.7 through about 1.5 eV. Therefore, ion irradiation energy is reduced, thereby alleviating damage to the film to be etched. In addition, because the microwave energy is introduced in a large area through the RLSA 54, the plasma etching apparatus can easily process large size wafers. Moreover, since the gas conduit 80 is made to pass through the inner conductor 68 of the axial pipe 66, which is an end portion of the microwave transmission line 58, and the process gas is introduced into the chamber 10 from the gas ejection opening 86 through the gas conduit 80, plasma density uniformity and thus over-the-wafer uniformity of the etching rate can be improved without any adverse effects of reduced antenna performance and abnormal discharging.

In addition, since the microwave plasma etching apparatus 1 generates the microwave plasma without applying a magnetic field to the chamber 10, the need for a magnetic field generation mechanism including a permanent magnet, a magnetic coil, or the like can be eliminated, so that the microwave plasma etching apparatus has a simple configuration. Even so, the plasma etching apparatus according to the embodiment may be another type of plasma etching apparatus employing, for example, Electron Cyclotron Resonance (ECR).

Figure 4:
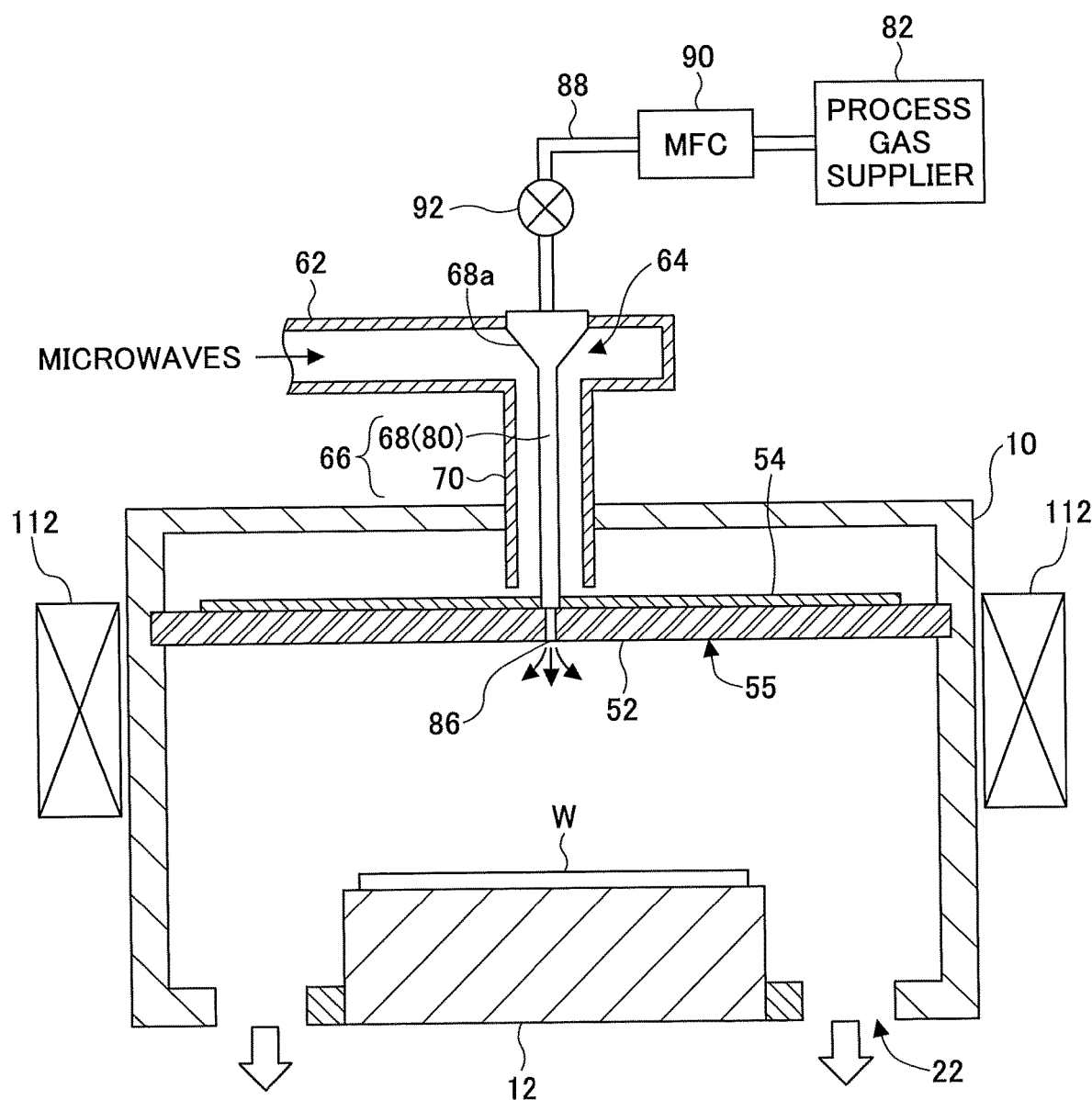
FIG. 4 is a schematic cut-open view of a modification example of the plasma process apparatus according to the first embodiment.

Referring to FIG. 4, an ECR plasma process apparatus includes a magnet field generation mechanism 112 having a permanent magnet or a magnetic coil around the chamber 10. The magnetic field generation mechanism 112 can apply a magnetic field to a plasma generation space in the chamber 10 so that the frequency of the microwaves is equal to the electron cyclotron frequency at any point in the plasma generation space, by which high density plasma can be generated. The magnetic field may be 875 Gauss in the case of 2.45 GHz.

By the way, the second process gas introduction portion 94 (FIG. 1) can be omitted, as shown in FIG. 4, while the first process gas introduction portion 88 is employed in order to introduce the process gas from the upper center portion (the gas ejection opening 86) of the chamber 10.

Figure 5:
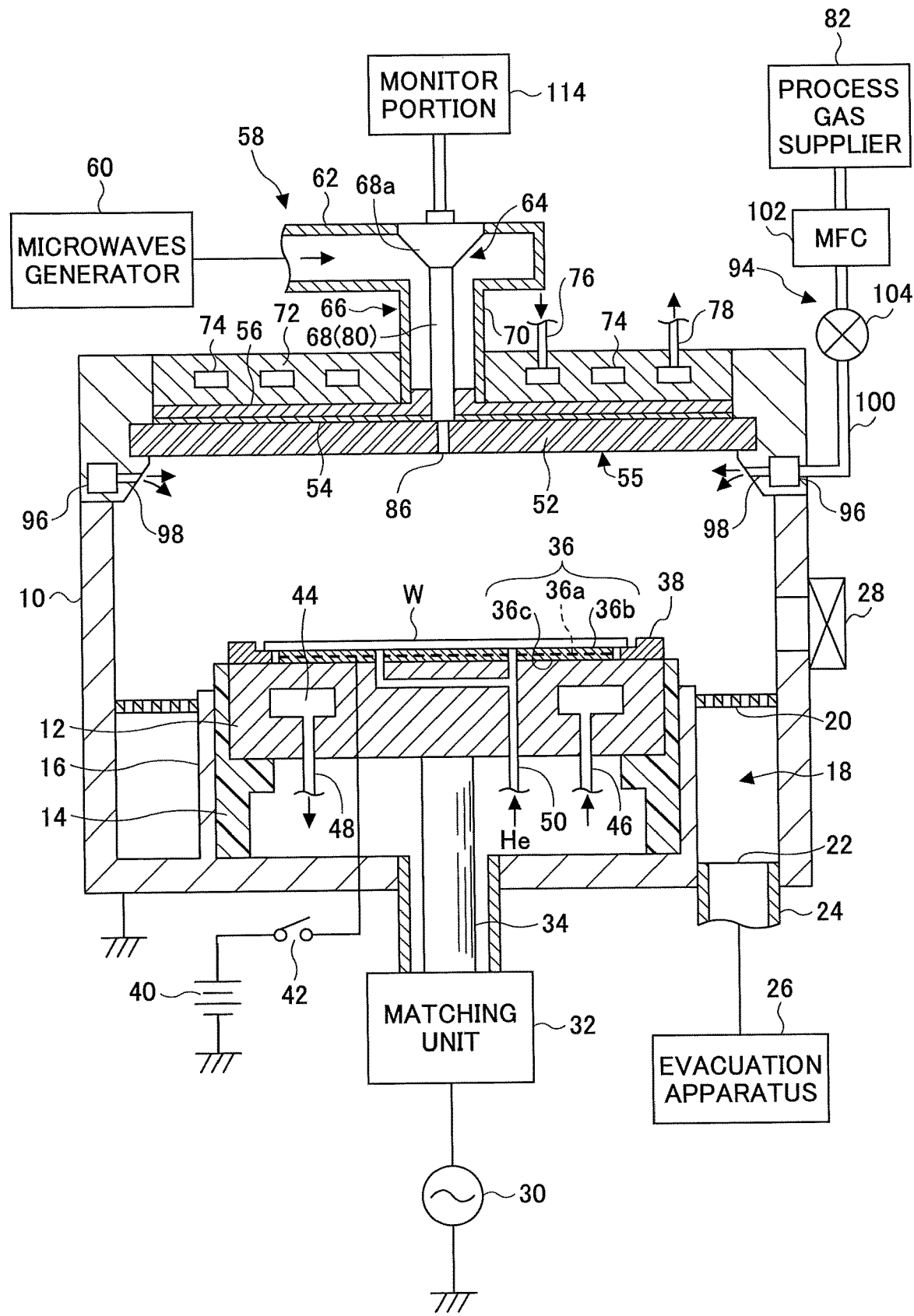
FIG. 5 is a schematic cut-open view of another modification example of the plasma process apparatus according to the first embodiment.

In addition, a hollow space formed in the inner conductor 68 of the coaxial pipe 66, which corresponds to the gas conduit 80 in FIG. 2, may be used for other purposes in other embodiments. Referring to FIG. 5, a monitor portion 114 is located above the inverse cone portion 68a, and the hollow space of the inner conductor 68 serves as an optical measurement line through which the plasma process is monitored by the monitor portion 114. For example, in order to detect an end point of plasma etching, the plasma spectrum may be observed by the monitor portion 114 through an optical fiber probe (not shown) that is inserted into the hollow space located at the upper center portion of the chamber 10, and analyzed by spectrometry. With this, the end point can be known when a peak intensity of a particular emission originating from a particular gas specie is increased or decreased. In addition, the hollow space of the inner conductor 68 may be used as a light path through which a laser beam propagates, in order to measure the thickness of an antireflection film or a resist film on the wafer W. Moreover, a temperature sensor having the thermocouple at the distal end may be inserted through the hollow space of the inner conductor 68 in order to measure a temperature at and around the upper center portion of the chamber 10. The monitor 114 monitors the plasma process via a through hole 86 provided in the dielectric plate 55, wherein through-hole 86 has a diameter smaller than that of the hollow pipe 68(80).

In addition, the inner conductor 68 of the coaxial pipe 66 may have different conduits from the conduit 80. For example, a plural pipe configuration employing, for example, a double pipe may be employed in the inner conductor 68 of the coaxial pipe 66, instead of the gas conduit 80. In this case, each pipe of the plural pipes can be used as an independent line (a gas supplying line, a measurement line, or the like). Moreover, a third process gas introduction portion may be provided to the plasma etching apparatus 1 according to this embodiment, in addition to or instead of the first and the second process gas introduction portions 88, 94, in order to introduce the process gasses into the chamber 10.

In addition, various alterations and modifications can be made to each component or member or their functions described above. For example, another type slot antenna can be used instead of the RLSA 54. Especially, when large plasma area is not required, the microwaves may be introduced into chamber not through an antenna but through a duct, which may be referred to as a microwave injection method. Moreover, the microwave transmission line 58 may be differently configured. For example, another transmission line may be inserted between the microwave generator 60 and the waveguide pipe 62 having a square-shaped opening. In addition, a circular pipe may be used instead of the waveguide pipe 62. Moreover, the inverse cone portion 68a of the converter 64 may be made into a ridge guide shape instead of the door knob shape. Furthermore, a circular waveguide pipe may be electromagnetically coupled to the chamber 10 without employing the converter 64.

Second Embodiment

Figure 6:
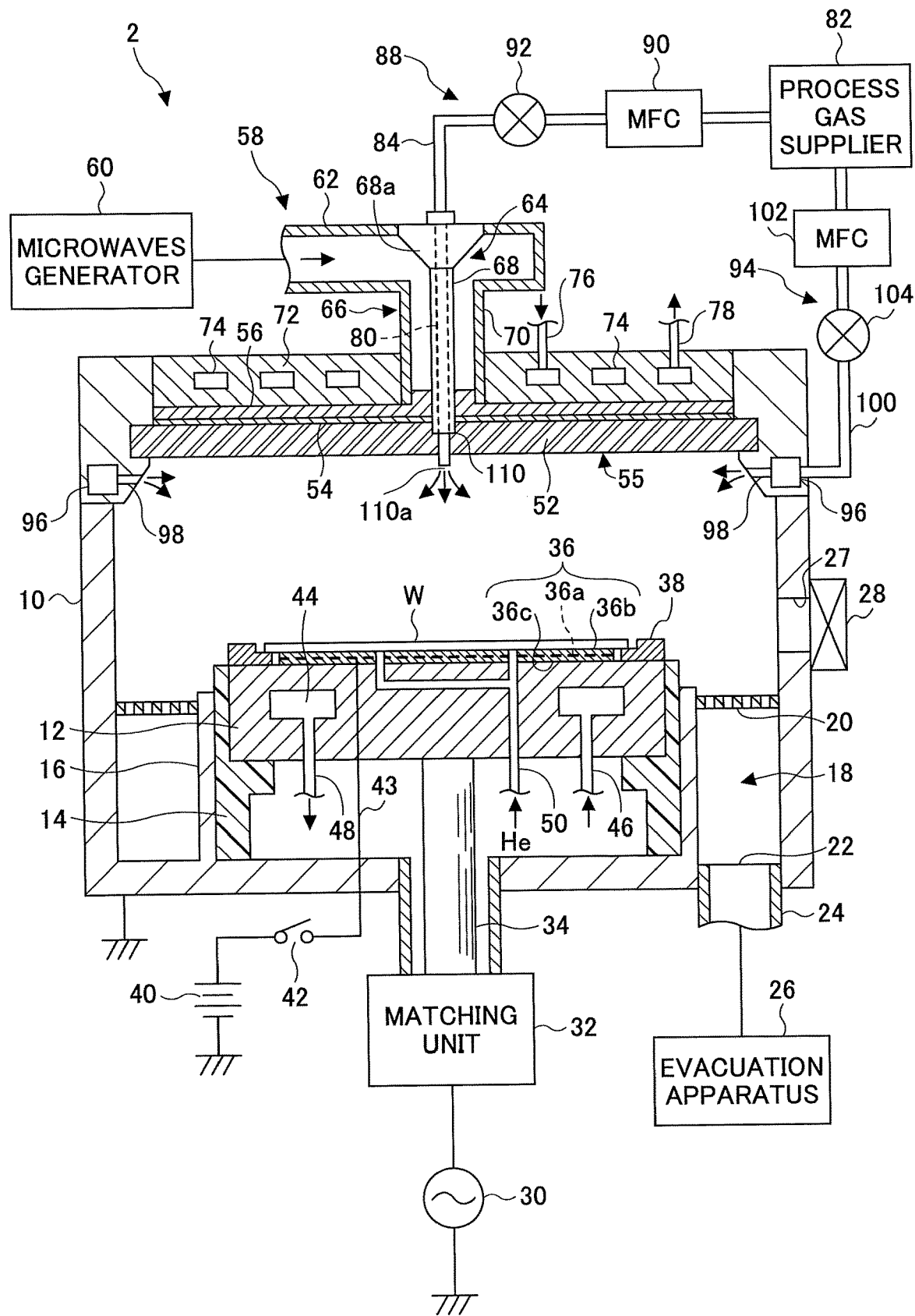
FIG. 6 is a schematic cut-open view of a plasma process apparatus according to a second embodiment.

Referring to FIGS. 6 through 9, a plasma process apparatus according to a second embodiment is described. FIG. 6 is a schematic cut-open view of the plasma process apparatus 2 according to the second embodiment. While the plasma process apparatus 2 according to the second embodiment is operated, when etching the wafer W in substantially the same manner as the plasma process apparatus 1 according to the first embodiment, the plasma process apparatus 2 is different in a gas ejection configuration at the top center portion of the chamber 10 from the plasma process apparatus 1 according to the first embodiment. The following explanation is focused on the difference.

As shown in FIG. 6, the gas conduit 80 goes through the inner conductor 68 of the coaxial pipe 66, and the top portion of the gas conduit 80 is connected to the process gas supplier 82 through the first gas supplying pipe 84, which places the gas conduit 80 in gaseous communication with the first gas supplying pipe 84. In addition, a conductive injector portion 110 is connected to the lower portion of the inner conductor 68 so as to be in gaseous communication with the gas conduit 80. The injector portion 110 penetrates the quartz plate 52 and protrudes downward from the lower surface of the quartz plate 52. In addition, the injector portion 110 has a gas ejection opening 110a at the bottom end, through which the process gas is ejected into the chamber 10.

In a first process gas introduction portion 88 having such a configuration, the process gas supplied at a predetermined pressure from the process gas supplier 82 flows through the first gas supplying pipe 84, the gas conduit 80, and the injector portion 110 in this order, and is ejected into the plasma region in the chamber 10 from the gas ejection opening 110a of the injector portion 110. By the way, the first process gas supplying pipe 84 has a mass flow controller (MFC) 90 and an open/close valve 92.

Figure 7:
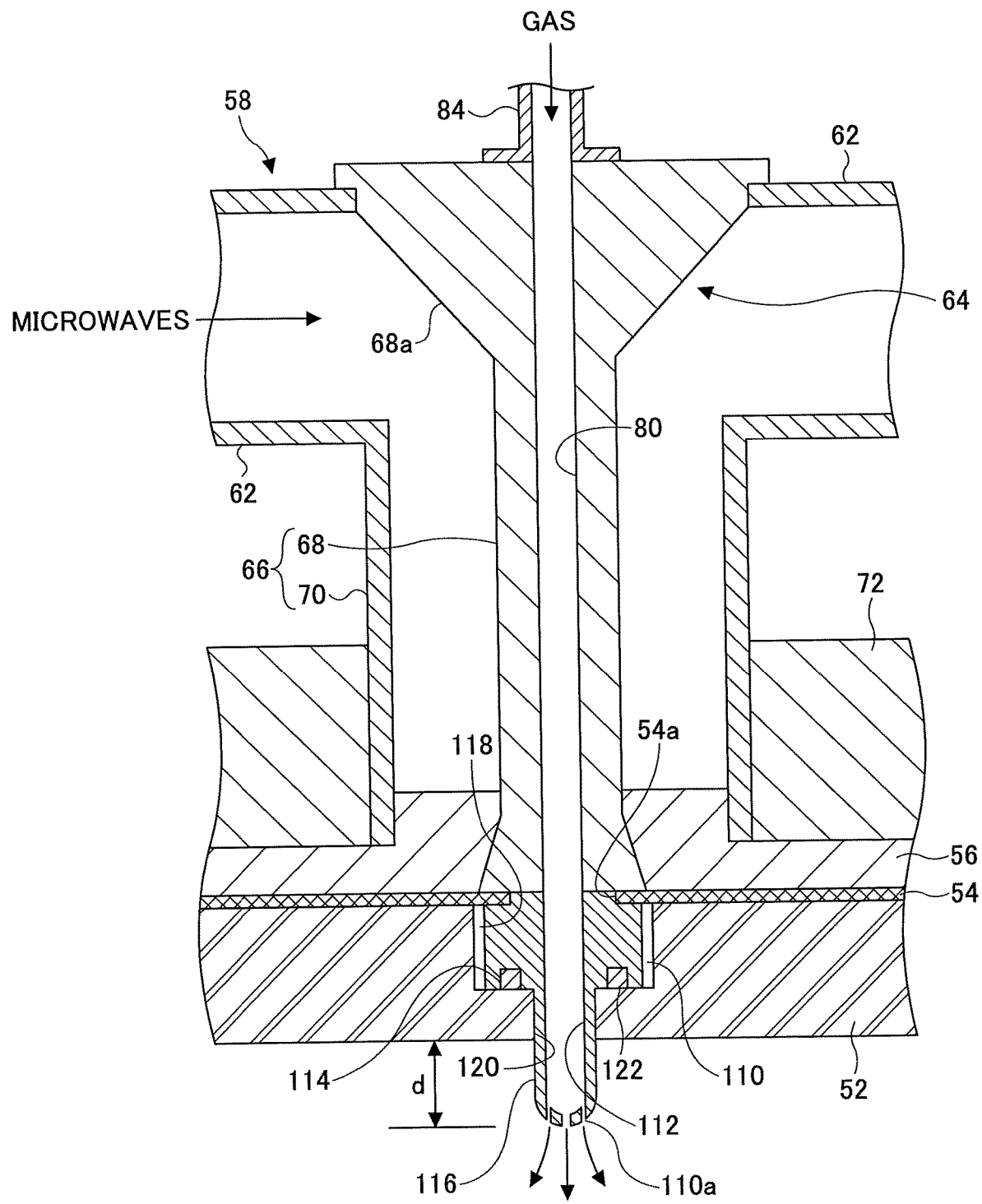
FIG. 7 schematically shows a primary portion of the plasma process apparatus shown in FIG. 6.

Referring to FIG. 7, the coaxial pipe 66 and the injector portion 110 are shown in detail. The inner conductor 68 of the coaxial pipe 66 is made of, for example, aluminum, and has the gas conduit 80 penetrating the inner conductor 68 along a center axis of the inner conductor 68. The injector portion 110 is also made of, for example, aluminum, and has a gas conduit 112 in gaseous communication with the gas conduit 80 in the inner conductor 68 of the coaxial pipe 66. By the way, the first gas supplying pipe 84 may be made of a metal (or conductor), or a resin (or insulator).

The injector portion 110 is composed of an upper half portion 114 having a large diameter and a lower half portion 116 having a small diameter. The upper half portion 114 is fitted into a concave portion 118 famed in the quartz plate 52, and the lower half portion 116 is inserted into a through hole 120 that extends from the center bottom of the concave portion 118 through the lower surface of the quartz plate 52. A seal member 122 such as an O ring is sandwiched by the upper half portion 114 and the bottom surface of the concave portion 118, and thus hermetically seal the upper half portion 114 relative to the concave portion 118 (the quartz plate 52). By the way, the coaxial pipe 66 and the injector portion 110 are preferably arranged along a normal line passing through a center of axial symmetry, or the center of RLSA 54 (the chamber 10 and the susceptor 12).

As shown in FIG. 7, an upper portion of the injector portion 110 contacts an opening 54a of the RLSA 54. Therefore, the injector portion 110 can be grounded via the RLSA 54 and the chamber 10, or through the inner conductor 68 of the coaxial pipe 66, the outer conductor 70, the antenna back surface plate 72, and the chamber 10 in this order. In addition, the lower half portion 116 having the smaller diameter protrudes downward from the through hole 120 of the quartz plate 52 into the chamber 10. A protrusion distance d of the lower half portion 116 (or, the distance between the gas ejection opening 110a and the lower surface of the quartz plate 52) may be about 10 mm or more, for reasons described below.

As stated above, the gas conduit 80 goes through the inner conductor 68 of the axial pipe 66, which is an end portion of the microwave transmission line 58. In addition, the conductive injector portion 110, which is in gaseous communication with the gas conduit 80, is connected to the lower end portion of the inner conductor 68 and grounded along with the inner conductor 68. Moreover, the injector portion 110 penetrates the RLSA 54 and the quartz plate 52 so as to protrude into the chamber 10.

With this configuration, since the inner conductor 68 and the electrically conductive injector portion 110 through which the process gas flows from the process gas supplier 82 to the chamber 10 are grounded through the chamber 10, the process gas is not exposed to the microwaves before reaching the chamber 10. Therefore, no undesired ionization (abnormal discharging) takes place in the process gas flow path from the process gas supplier 82 to the gas ejection openings 110a. Especially, the electric field inside the quartz plate 52 cannot be leaked to the gas conduit 112 in the injector portion 110, because the gas conduit 112 is shielded from the electric field by the injector portion 110. Therefore, no abnormal discharging takes place inside the quartz plate 52. Accordingly, plasma characteristics such as the plasma generation efficiency, plasma density distribution and the like can be stably maintained, thereby improving the process performance. Additionally, the quartz plate 52 is prevented from being deteriorated or damaged, thereby lengthening the operational service life of the quartz plate 52.

In addition, since the injector portion 110 protrudes into the chamber 10 by an appropriate distance d, discharging can be prevented at the gas ejection opening 110a in this embodiment. As stated above, due to the microwave energy radiated from surface waves propagating along the lower surface of the quartz plate 52, the process gas molecules near the lower surface are ionized so that the microwave plasma is highly concentrated near the lower surface of the quartz plate 52. However, the surface wave energy is rapidly reduced only a slight distance away from the lower surface of the quartz plate 52. A region of reduced surface wave energy is called a plasma diffusion region where active species generated in the plasma can only diffuse. Namely, when the gas ejection opening 110a of the injector portion 110 is located away from the lower surface of the quartz plate 52 and in the plasma diffusion region, the ionization of the process gas is effectively prevented at the gas ejection opening 110a.

Figure 8:
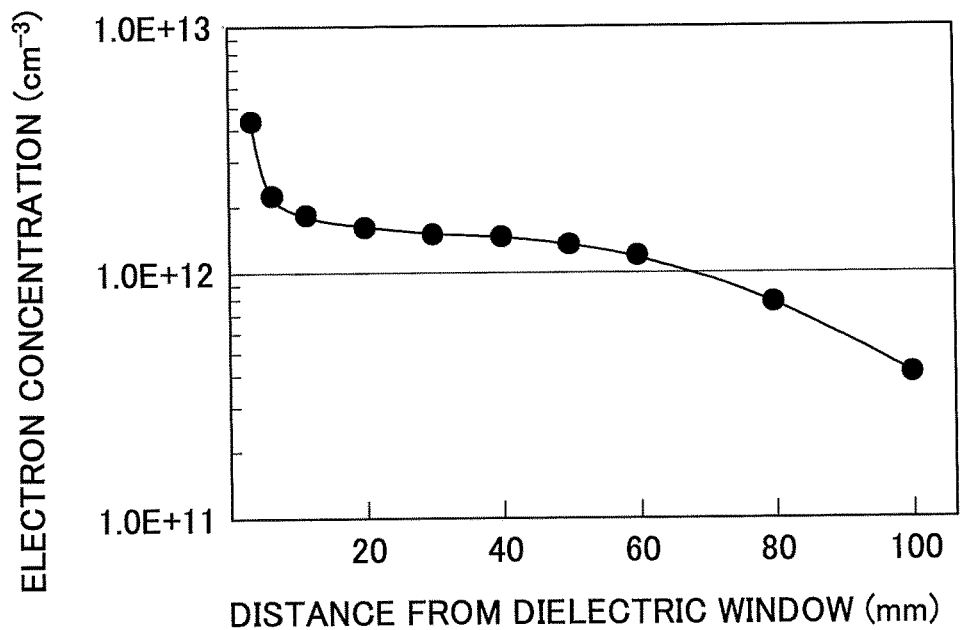
FIG. 8 shows an experimental result of electron density distribution along a direction from a dielectric window to a susceptor in the plasma process apparatus shown in FIG. 6.
Figure 9:
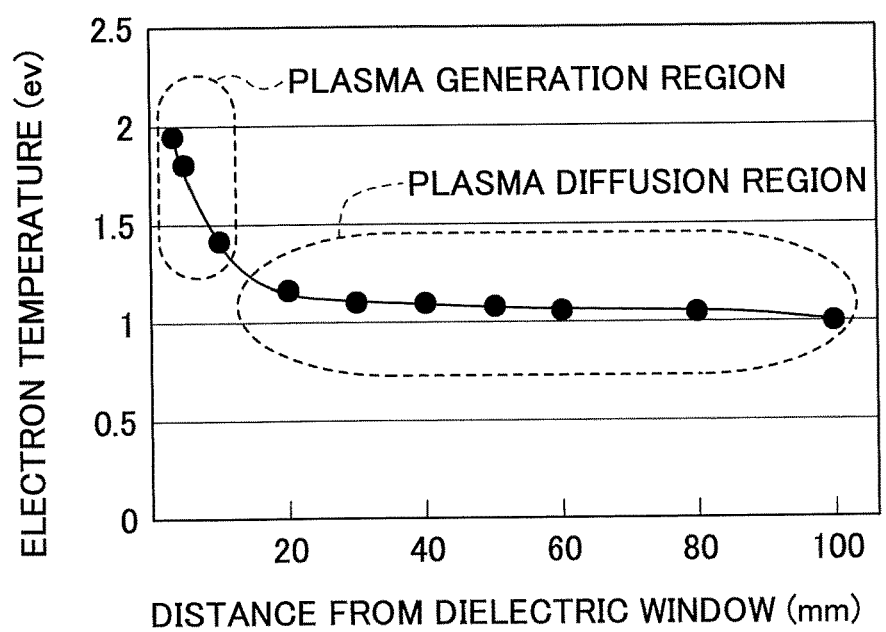
FIG. 9 shows an experimental result of electron temperature distribution along a direction from a dielectric window to a susceptor in the plasma process apparatus shown in FIG. 6.

FIG. 8 shows an experimental result of a plasma density distribution along a vertical direction (Z) in the microwave plasma process apparatus 2 according to the second embodiment. FIG. 9 shows an experimental result of a plasma temperature distribution along a vertical direction (Z) in the microwave plasma process apparatus 2 according to the second embodiment. From these figures, it is understood that any position at a distance about 10 mm or more from the dielectric window (the quartz plate 52) is in the plasma diffusion region. This is the reason why the protrusion distance d of the gas ejection opening 110a is determined to be about 10 mm or more. However, when the protrusion distance d becomes larger, it becomes difficult for the process gas ejected from the gas ejection opening 110a to flow upward and reach the quartz plate 52. Therefore, the protrusion distance d is preferably about 30 mm or less. In addition, the gas ejection opening 110a of the injector portion 110 is preferably located at a distance about 20 mm or more from the wafer W on the susceptor 12, considering whether the lower end of the injector portion 110 hinders the transfer of the wafer W into and out from the chamber 10, affects the microwave distribution and RF bias applied to the susceptor 12, which may affect an etching rate, and whether the distance over which the process gas can diffuse above the wafer W is sufficient enough to obtain a desired process gas distribution.

By the way, while FIG. 7 shows that the process gas is ejected downward from the gas ejection opening 110a, the process gas may be ejected horizontally from the lower end portion of the injector portion 110, or in a radial direction of the chamber 10. In addition, a plural pipe configuration employing, for example, a double pipe may be employed in the inner conductor 68 of the coaxial pipe 66. In this case, each pipe of the plural pipes can be used as an independent line (a gas supplying line, a measurement line, or the like).

In the second embodiment, since the gas conduit 80 located in the inner conductor 68 of the coaxial pipe 66 in order to introduce the process gas through the quartz plate (ceiling plate) 52 is used as part of the gas supplying line of the first process gas introduction portion 88, the through hole of the quartz plate 52 through which the gas supplying line (especially the injector portion 110) goes can be as short as possible, thereby reducing the probability of abnormal discharging.

Figure 10:
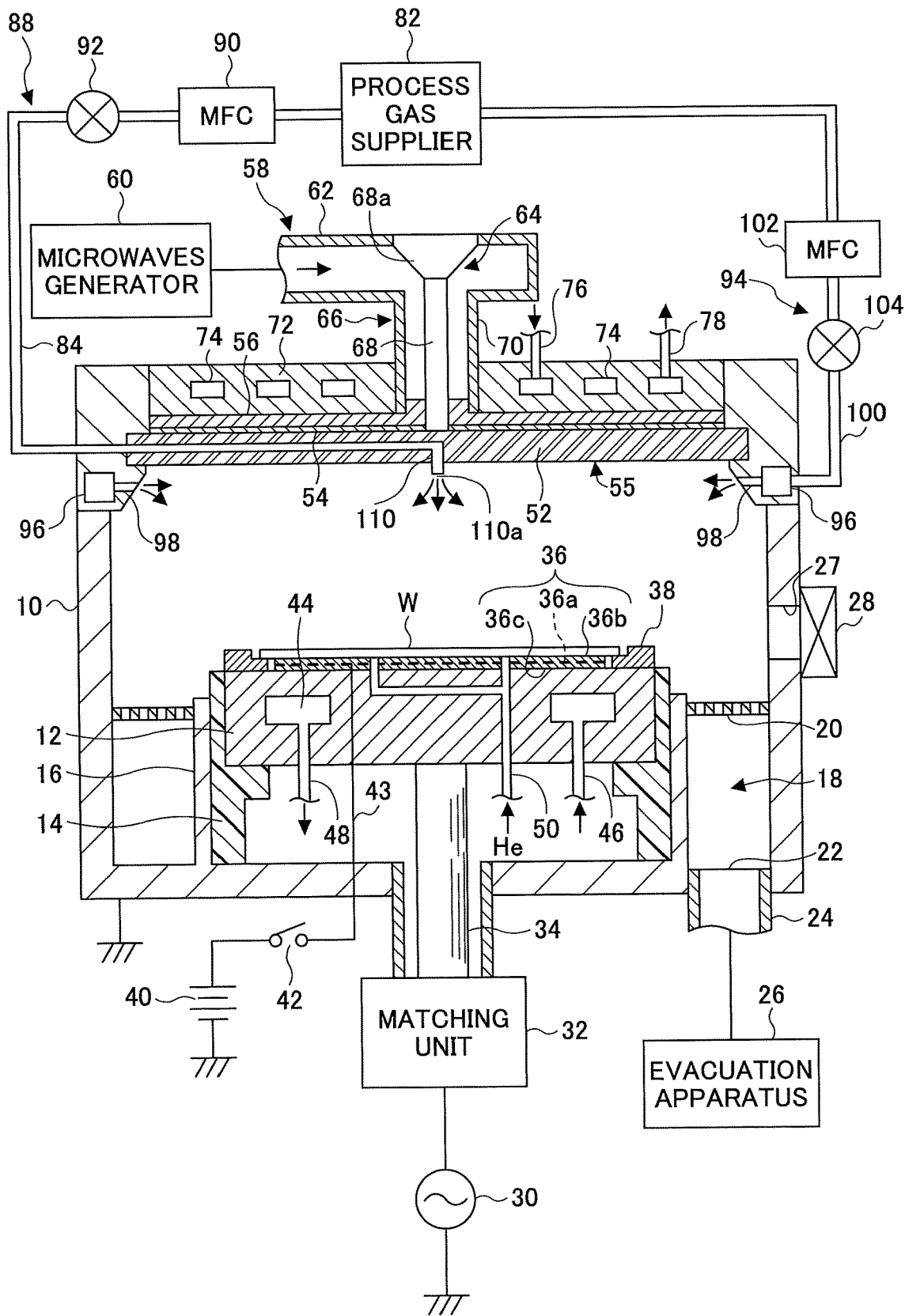
FIG. 10 is a schematic cut-open view of a modification example of the plasma process apparatus according to the second embodiment.

However, the gas supplying line in the first process gas introduction portion 88 may be modified so that the gas supplying line does not go through the inner conductor 68 of the coaxial pipe 66. For example, the first gas supplying pipe 84 may be inserted from a side wall of the quartz plate 52 through an opening made in a side wall of the chamber 10 and horizontally extended in the quartz plate 52, and may be bent at the center portion of the quartz plate 52 so as to protrude downward from the lower surface of the quartz plate 52 as shown in FIG. 10. Or, the first gas supplying pipe 84 may be connected to a side opening made in the injector portion 110 inside the quartz plate 52. In these cases, at least a portion of the first gas supplying pipe 84, the portion being located inside the quartz plate 52, is made of an electrically conductive material and grounded through the side wall of the chamber 10.

As another modification example of the plasma process apparatus 2 according to the second embodiment, the first gas supplying pipe 84, which is connected at one end to the process gas supplier 82, may go through the antenna back surface plate 72, the slow wave plate 56, the RLSA 54, and the quartz plate 52 in this order, rather than the inner conductor 68 of the coaxial pipe 66, although not shown. In this case, the first gas supplying pipe 84 may protrude at the other end downward from the lower surface of the quartz plate 52. Or, the other end of the first gas supplying pipe 84 may be connected to the side opening made in the injector portion 110 inside the quartz plate 52. In this configuration, plural of the injector portions 110 may be axially symmetrically provided in a ring shape. By the way, at least a portion of the first gas supplying pipe 84, the portion being located inside the quartz plate 52, is made of an electrically conductive material and grounded through the antenna back surface plate 72 or the RLSA 54.

As another modification, a third process gas introduction portion may be provided to the plasma etching apparatus 2 according to this embodiment, in addition to or instead of the first and the second process gas introduction portions 88, 94, in order to introduce the process gasses into the chamber 10. In addition, the second process gas introduction portion 94 (FIG. 1) can be omitted, while the first process gas introduction portion 88 is employed in order to introduce the process gas from the upper center portion (the gas ejection opening 86) of the chamber 10.

In addition, various alterations and modifications can be made to each component or member or their functions described above. For example, another type slot antenna can be used instead of the RLSA 54. Especially, when large area plasma is not required, the microwaves may be introduced into the chamber not through an antenna but through a duct, which may be referred to as a microwave injection method. Moreover, the microwave transmission line 58 may be differently configured. For example, another transmission line may be inserted between the microwave generator 60 and the waveguide pipe 62 having a square-shaped opening. In addition, a circular pipe may be used instead of the waveguide pipe 62. Moreover, the converter 64 may include a member in a ridge guide shape, instead of the inverse cone portion 68a in the door knob shape. Furthermore, a circular waveguide pipe may be electromagnetically coupled to the chamber 10 without employing the converter 64.

In addition, because the microwave plasma etching apparatus 2 according to the second embodiment generates the microwave plasma without applying a magnetic field to the chamber 10, the need for a magnetic field generation mechanism including a permanent magnet, a magnetic coil, or the like can be eliminated, so that the microwave plasma etching apparatus 2 has a simple configuration. Even so, the plasma etching apparatus according to an embodiment may be another type of plasma etching apparatus employing, for example, Electron Cyclotron Resonance (ECR), as described in reference to FIG. 4 in the first embodiment.

Embodiments according to the present invention are not limited to the microwave plasma etching apparatus in the above embodiment, but may be a plasma chemical vapor deposition (CVD) apparatus, a plasma oxidation apparatus, a plasma nitriding apparatus, a plasma sputtering apparatus, or the like. In addition, a substrate subjected to a plasma process is not limited to the semiconductor wafer, but may be various substrates for use in fabricating a flat panel display, a photomask, a CD substrate, a printed substrate, or the like.

Various aspects of the subject-matter described herein are set out non-exhaustively in the following numbered clauses:

1. A plasma process apparatus in which a substrate subjected to a predetermined plasma process is housed in a process chamber capable of being evacuated to a reduced pressure, and a process gas and microwaves are introduced into the process chamber so as to generate plasma from the process gas so as to perform the predetermined plasma process on the substrate, the plasma process apparatus comprising:
a microwave generator that outputs the microwaves;
a microwave transmission line that includes
a waveguide pipe that transmits the microwaves output from the microwave generator in a TE mode,
a coaxial pipe that includes an inner conductor and an outer conductor, coaxially provided and vertically extending above a dielectric plate provided at a ceiling of the process chamber for introducing the microwaves, and transmits the microwaves in a TEM mode, the inner conductor of the coaxial pipe being formed of a hollow pipe, a through hole that communicates with a path of the hollow pipe being provided in the dielectric plate, and
a waveguide pipe/coaxial pipe converter that couples the waveguide pipe and the coaxial pipe;
an antenna that is connected to an end portion of the coaxial pipe above the dielectric plate, and emits the microwaves transmitted from the microwave transmission line toward the process chamber; and
a monitor portion that monitors a process or a process condition in the process chamber by using a path of the hollow pipe and the through hole of the dielectric plate as a laser optical path.

2. A plasma process apparatus in which a substrate subjected to a predetermined plasma process is housed in a process chamber capable of being evacuated to a reduced pressure, and a process gas and microwaves are introduced into the process chamber so as to generate plasma from the process gas so as to perform the predetermined plasma process on the substrate, the plasma process apparatus comprising:
a microwave generator that outputs the microwaves;
a microwave transmission line that includes
a waveguide pipe that transmits the microwaves output from the microwave generator in a TE mode,
a coaxial pipe that includes an inner conductor and an outer conductor, coaxially provided and vertically extending above a dielectric plate provided at a ceiling of the process chamber for introducing the microwaves, and transmits the microwaves in a TEM mode, the inner conductor of the coaxial pipe being formed of a hollow pipe, a through hole that communicates with an opening at a lower end of the hollow pipe being provided in the dielectric plate, and
a waveguide pipe/coaxial pipe converter that couples the waveguide pipe and the coaxial pipe; and
an antenna that is connected to an end portion of the coaxial pipe above the dielectric plate, and emits the microwaves transmitted from the microwave transmission line toward the process chamber; and
a monitor portion that includes a line for measuring temperature that passes in the hollow pipe, and a temperature sensor attached at an end of the line for measuring temperature, in order to measure temperature near a center of a ceiling plate at an upper portion of the process chamber.

What is claimed is:

1. A plasma process apparatus in which a substrate subjected to a predetermined plasma process is housed in a process chamber capable of being evacuated to a reduced pressure, and a process gas and microwaves are introduced into the process chamber so as to generate plasma from the process gas so as to perform the predetermined plasma process on the substrate, the plasma process apparatus comprising:
a microwave transmission line that transmits the microwaves from a microwave generator to the process chamber, wherein a predetermined section of the microwave transmission line is formed of a coaxial line whose inner conductive body is formed of a hollow pipe, the section including one end portion of the microwave transmission line;
a dielectric plate configured to seal a plasma generation space in the process chamber, a monitor that is configured to monitor, through the hollow pipe, the plasma process performed in the process chamber, and an inverse cone portion provided in the coaxial line under the monitor and connected to the hollow pipe, wherein the monitor is configured to monitor the plasma process via a through hole in the dielectric plate, wherein the through hole has a diameter smaller than that of the hollow pipe.

2. The plasma process apparatus of claim 1, wherein the monitor includes a plasma emission measurement portion that spectroscopically measures emission of the plasma in the process chamber.

3. The plasma process apparatus of claim 1, wherein the monitor includes an optical thickness measurement portion that measures a thickness of a film on the substrate held on a susceptor in the process chamber.

4. The plasma process apparatus of claim 1, wherein the monitor includes a temperature sensor that measures temperature inside the process chamber.

5. The plasma process apparatus of claim 1, further comprising:

the microwave generator that outputs the microwaves; and an antenna that emits the microwaves transmitted from the microwave transmission line toward the process chamber, wherein the microwave transmission line includes a waveguide pipe that transmits the microwaves output from the microwave generator in a TE mode, the coaxial pipe that includes the inner conductor and an outer conductor, coaxially provided and vertically extending above the dielectric plate provided at a ceiling of the process chamber for introducing the microwaves, and transmits the microwaves in a TEM mode, the through hole with a path of the hollow pipe, and a waveguide pipe/coaxial pipe converter that couples the waveguide pipe and the coaxial pipe, wherein the antenna is connected to an end portion of the coaxial pipe above the dielectric plate, and wherein the monitor is configured to monitor a process or a process condition in the process chamber by using a path of the hollow pipe and the through hole of the dielectric plate as a laser optical path.

6. The plasma process apparatus of claim 1, further comprising:

the microwave generator that outputs the microwaves; and an antenna emits the microwaves transmitted from the microwave transmission line toward the process chamber, wherein the microwave transmission line includes a waveguide pipe that transmits the microwaves output from the microwave generator in a TE mode, the coaxial pipe that includes the inner conductor and an outer conductor, coaxially provided and vertically extending above the dielectric plate provided at a ceiling of the process chamber for introducing the microwaves, and transmits the microwaves in a TEM mode, the through hole that communicates with an opening at a lower end of the hollow pipe being provided in the dielectric plate, and a waveguide pipe/coaxial pipe converter that couples the waveguide pipe and the coaxial pipe, wherein the antenna is connected to an end portion of the coaxial pipe above the dielectric plate, and wherein the monitor includes a line for measuring temperature that passes in the hollow pipe, and a temperature sensor attached at an end of the line for measuring temperature, in order to measure temperature near a center of a ceiling plate at an upper portion of the process chamber.

7. The plasma process apparatus of claim 1, further comprising a circular radial line slot antenna provided on an upper surface of the dielectric plate and a slow wave plate provided on the circular radial line slot antenna so as to electromagnetically connect the microwave transmission line to the circular radial line slot antenna.

* * * * *